(12) United States Patent
Chen

(10) Patent No.: US 8,405,968 B2
(45) Date of Patent: Mar. 26, 2013

(54) MOUNTING APPARATUS FOR STORAGE DEVICE

(75) Inventor: Li-Ping Chen, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 268 days.

(21) Appl. No.: 12/875,591

(22) Filed: Sep. 3, 2010

(65) Prior Publication Data

US 2011/0186703 A1 Aug. 4, 2011

(30) Foreign Application Priority Data

Feb. 3, 2010 (CN) .......................... 2010 2 0302201

(51) Int. Cl.
*G06F 1/16* (2006.01)
*H05K 7/16* (2006.01)
*A47B 81/00* (2006.01)
*A47F 7/00* (2006.01)

(52) U.S. Cl. ......... 361/679.33; 361/679.31; 361/679.37; 361/679.39; 361/726; 361/727; 312/223.1; 312/223.2; 211/26

(58) Field of Classification Search .. 361/679.31–679.4, 361/724–727; 312/223.1, 223.2; 211/26
See application file for complete search history.

(56) References Cited

U.S. PATENT DOCUMENTS

| | | | | |
|---|---|---|---|---|
| 6,058,016 A * | 5/2000 | Anderson et al. | ............. | 361/727 |
| 6,067,225 A * | 5/2000 | Reznikov et al. | ........ | 361/679.31 |
| 6,122,165 A * | 9/2000 | Schmitt et al. | ........... | 361/679.31 |
| 6,343,009 B1 * | 1/2002 | Liu et al. | .................. | 361/679.31 |
| 6,661,651 B1 * | 12/2003 | Tanzer et al. | ............ | 361/679.33 |
| 7,057,890 B2 * | 6/2006 | Chang | ...................... | 361/679.32 |
| 7,321,489 B2 * | 1/2008 | McAlister | ................ | 361/679.33 |
| 2004/0047122 A1 * | 3/2004 | Chen et al. | .................... | 361/685 |
| 2004/0105229 A1 * | 6/2004 | Wang et al. | ................... | 361/685 |
| 2005/0237709 A1 * | 10/2005 | Huang | ......................... | 361/685 |

* cited by examiner

*Primary Examiner* — Jayprakash N Gandhi
*Assistant Examiner* — Midhi Desai
(74) *Attorney, Agent, or Firm* — Altis Law Group, Inc.

(57) ABSTRACT

A mounting apparatus for a storage device includes a chassis, a carrier and a bracket configured to secure the storage device to the chassis. The carrier includes a handle and a first extending arm, the handle is configured to secure the carrier to the chassis, and a positioning slot is defined in the first extending arm. The bracket includes a first side plate. An elastic securing piece is disposed on the first side plate, and a latch is formed on the securing piece. The latch is engaged in the positioning slot of the first extending arm to mount the bracket to the carrier.

18 Claims, 5 Drawing Sheets

MOUNTING APPARATUS FOR STORAGE DEVICE

BACKGROUND

1. Technical Field

The present disclosure relates to a mounting apparatus for mounting a storage device.

2. Description of Related Art

In a conventional computer, a storage device is typically secured to a drive bracket with screws. A significant drawback to this is that the insertion and removal of screws is cumbersome and time consuming. In addition, a tool such as a screwdriver is usually required. Moreover, the screws can be accidentally lost during assembly or disassembly.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
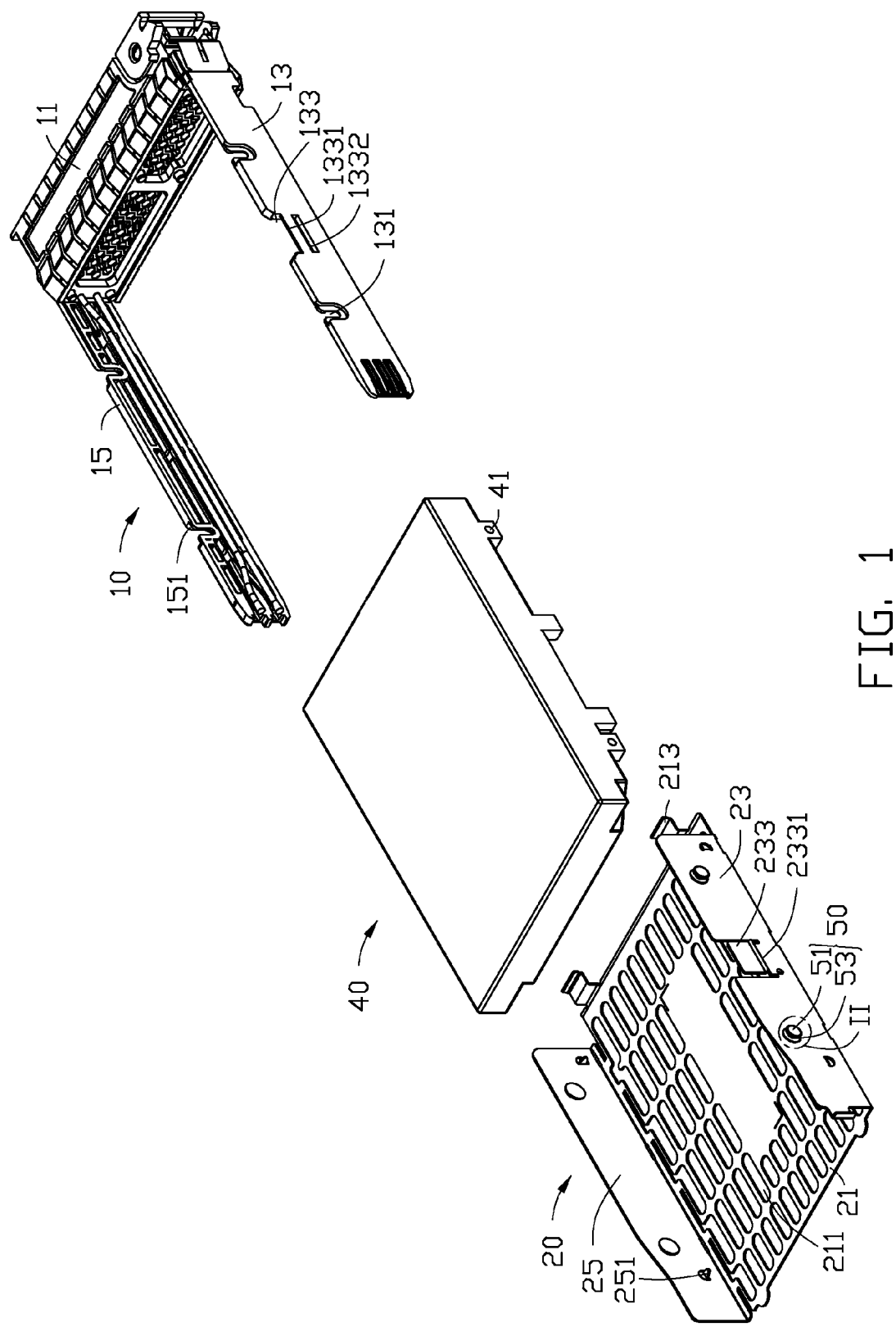
FIG. 1 is a partially, exploded view of a mounting apparatus and a storage device in accordance with an embodiment.
Figure 2:
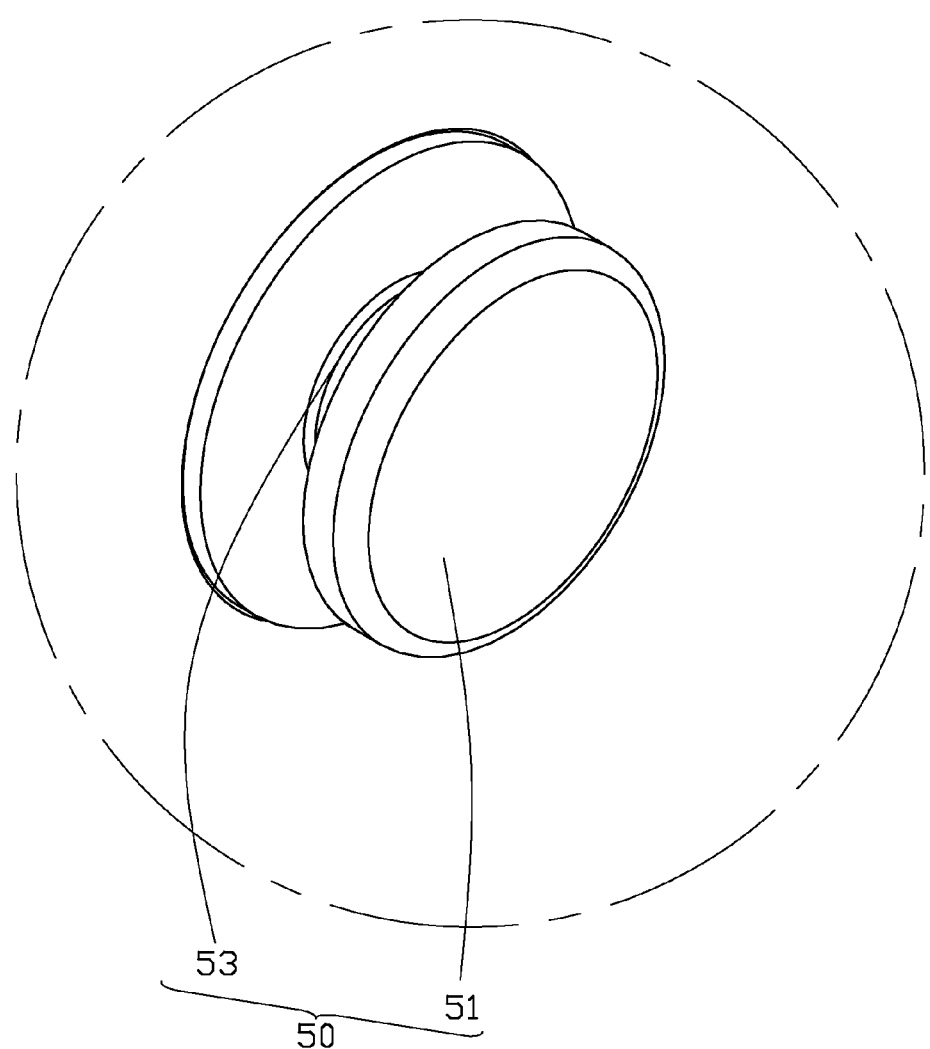
FIG. 2 is an enlarged view of circled portion II of FIG. 1.
Figure 3:
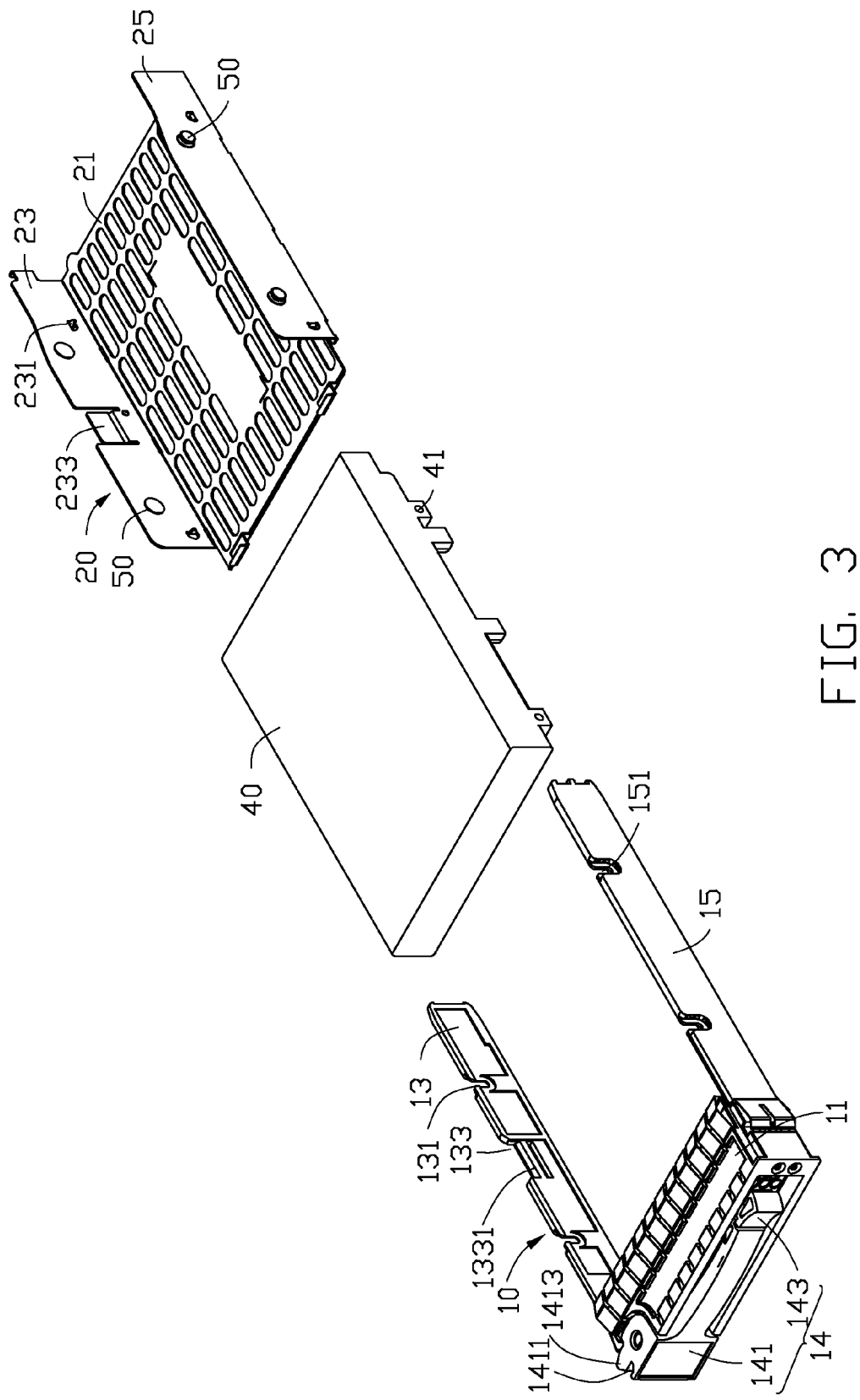
FIG. 3 is similar to FIG. 1, but viewed from a different aspect.

Referring to FIG. 1 and FIG. 3, a mounting apparatus in accordance with an embodiment includes a carrier 10, a bracket 20 received in the carrier 10, and a chassis 30 (shown in FIG. 5) configured to secure the carrier 10.

Figure 5:
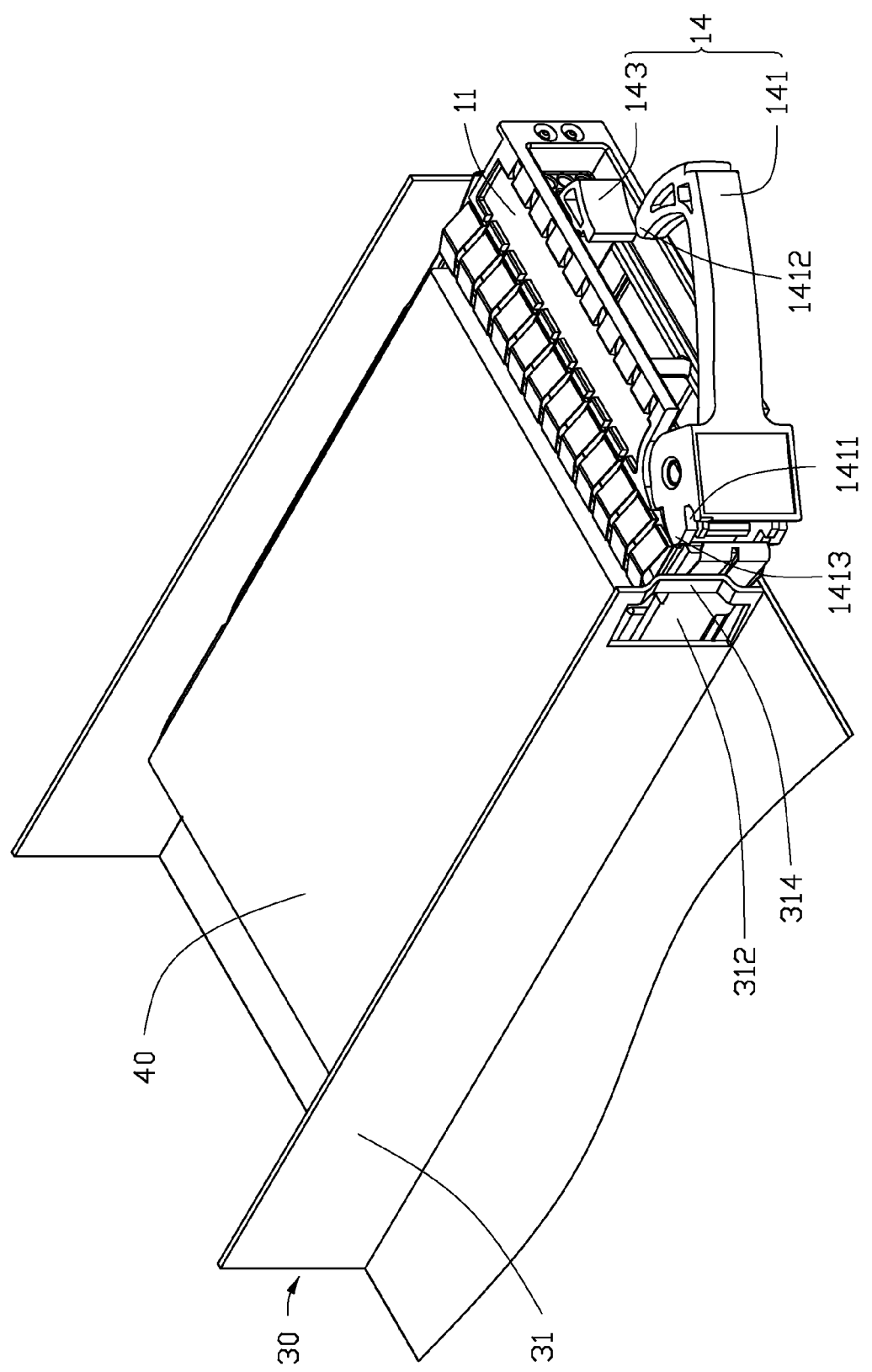
FIG. 5 is a cutaway, assembled view of the mounting apparatus.

Referring to FIG. 1 and FIG. 5, the carrier 10 includes a connecting arm 11, a first extending arm 13 connected to an edge of the connecting arm 11, and a second extending arm 15 connected to an opposite edge of the connecting arm 11. In one embodiment, the first extending arm 13 is substantially perpendicular to the connecting arm 11 and substantially parallel to the second extending arm 15. A handle 14 is mounted on the front of the connecting arm 11 and is capable of being rotated to position the carrier 10 in the chassis 30. The handle 14 includes a rotating portion 141 and a clipping portion 143, capable of engaging with the rotating portion 141. A clipping hole 1411 is defined in an end of the rotating portion 141, and a catch 1412 is disposed on an opposite end of the rotating portion 141. A protrusion 1413 is formed on a side of the clipping hole 1411. The catch 1412 is configured to engage with the clipping portion 143. In one embodiment, the catch 1412 is arc.

Referring to FIG. 1, the first extending arm 13 defines two positioning holes 131, and the second extending arm 15 defines two positioning holes 151. In one embodiment, the positioning holes 131 and 151 are formed from the top edge of the first and second extending arm 13 and 15. An indentation 133 is defined on the first extending arm 13, and a clipping piece 1331 connects to the two opposite sides of the indentation 133. A positioning slot 1332 is defined between the clipping piece 1331 and the bottom of the indentation 133.

The bracket 20 includes a bottom plate 21, a first side plate 23 bent from an edge of the bottom plate 21, and a second side plate 25 bent from an opposite edge of the bottom plate 21. In one embodiment, the first and second side plate 23 and 25 are elastically deformable. A number of dissipating holes 211 are defined in the bottom plate 21, and two spring clips 213 extend from the front edge of the bottom plate 21. The spring clips 213 are configured to clip to the connecting arm 11. Two positioning post 50 are disposed on the first side plate 23 and the second side plate 25, and two hooks 231 and 251 are distorted toward inside of the first side plate 23 and the second side plate 25. Each positioning post 50 includes a head 51 and a neck 53 connected to the head 51. In one embodiment, the diameter of the head 51 is greater than that of the neck 53. The neck 53 is capable of positioning in the positioning hole 131 and 151 of the carrier 10, and the head 51 is placed outside of first and second extending arm 13 and 15. An elastic securing piece 233 is formed between the two positioning posts 50 of the first side plate 23, corresponding to the indentation 133 of the first extending arm 13. A latch 2331 is disposed on the bottom of securing piece 233, corresponding to the positioning slot 1332 of the first extending arm 13. In one embodiment, the latch 2331 is outside of the first side plate 23.

Two through holes 41 are defined in two opposite sides of a storage device 40, corresponding to the hooks 231 and 251 of the bracket 20.

Referring to FIG. 5, a number of separating panels 31 are disposed in the chassis 30, and the two adjacent separating panels 31 define a space to receive the carrier 10. A slot 312 is defined in the front of each separating panel 31, corresponding to the protrusion 1413 of the rotating portion 141, and a blocking piece 314 is located at the edge of the slot 312, corresponding to the clipping hole 1411 of the rotating portion 141.

Figure 4:
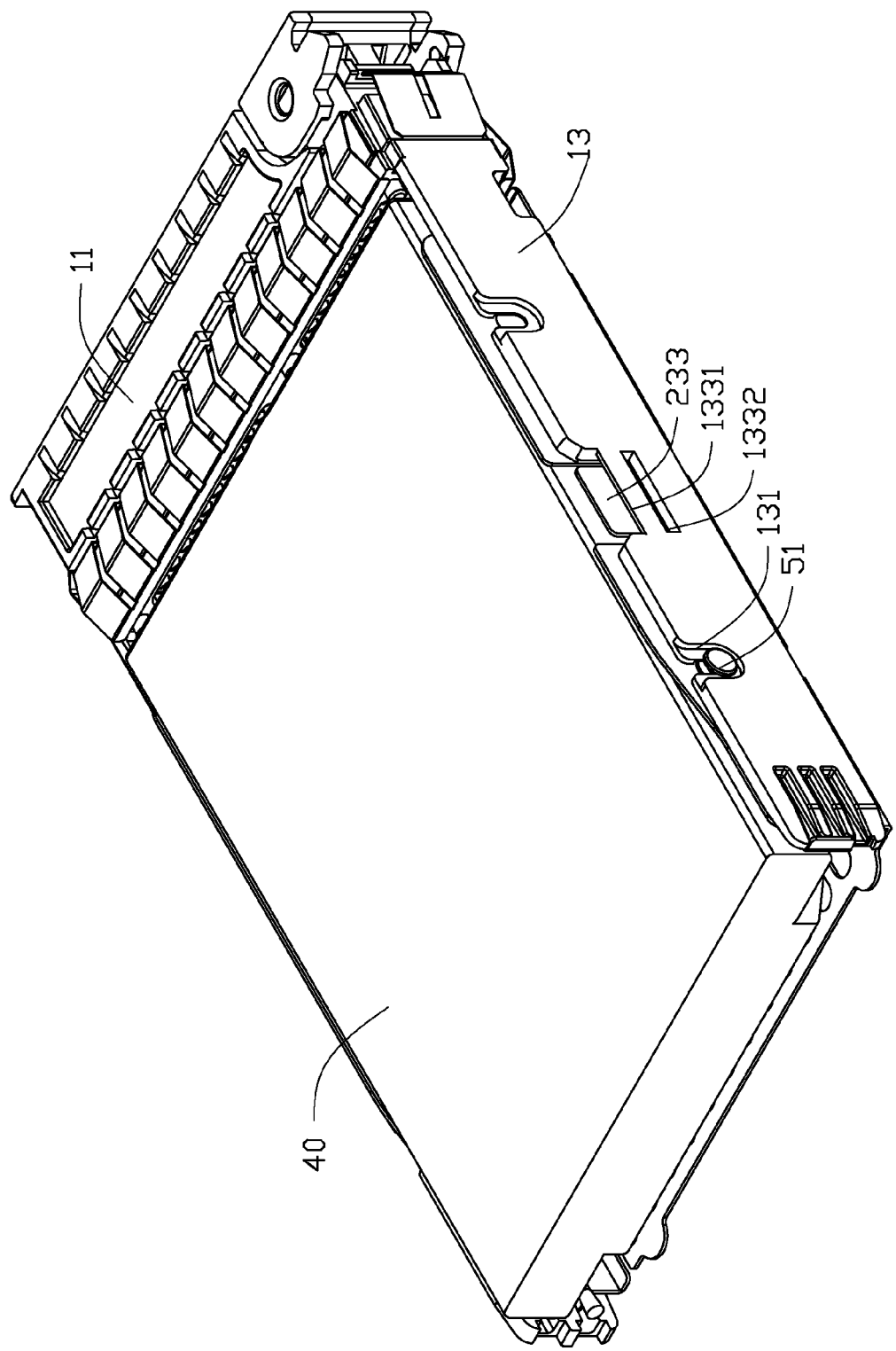
FIG. 4 is an assembled view of the mounting apparatus and the storage device of FIG. 1.

Referring to FIGS. 4-5, in assembly, the storage device 40 is placed in the bracket 20, and the first side plate 23 and the second side plate 25 are in elastically distorted toward outside. The hooks 231 and 251 of the first and second side plate 23 and 25 are inserted into the through holes 41 of the storage device 40. The first side plate 23 and the second side plate 25 are released inside to secure the storage device 40 to the bracket 20.

The assembled storage device 40 and the bracket 20 are placed in the carrier 10, and the latch 2331 of the first side plate 23 abuts against the clipping piece 1331 of the first extending arm 13. When the storage device 40 is pushed further into the carrier 10, the latch 2331 forces the clipping piece 1331, and the clipping piece 1331 is elastically distort toward the outside of the first extending arm 13. Thus, the latch 2331 is capable of passing through the clipping piece 1331, to engage with the positioning slot 1332. At the same time, the neck 53 of each positioning post 50 is located in the positioning holes 131 and 151 of the first and second extending arms 13 and 15, and the spring clips 213 of the bottom plate 21 is clipped on the connecting arm. In an original state, the clipping portion 143 of the handle 14 on the carrier 10 is not engaged with the catch 1412 of the rotating portion 141, and the rotating portion 141 is rotated apart from the connecting arm 11.

The carrier 10 is placed on the front of the space between two separating panels 31 with the handle 14. When the carrier 10 is further pushed into the space, the catch 1412 of rotating portion 141 is engaged with the clipping portion 143. The protrusion 1413 of the rotating portion 141 is positioned in the slot 312, and the blocking piece 314 is received in the clipping hole 1411 adjacent to the protrusion 1413.

In disassembly, the catch 1412 is disengaged from the clipping portion 143, and the protrusion 1413 comes out of the slot 312. The latch 2331 of the bracket 20 is forced to disengage from the positioning slot 1332. The bracket 20 is separated in a direction apart from the carrier 10, and each positioning post 50 is moved apart from the positioning holes 131 and 151 of the first and second extending arm 13 and 15. The first and second side plates 23 and 25 are forced to move outside, so that the hooks 231 and 251 are disengaged from the through holes 41 of the storage device 40. Thus, the storage device 40 can be removed from the bracket 20.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus for a storage device, the mounting apparatus comprising: a chassis; a carrier, secured to the chassis, comprising a handle and a first extending arm, the handle is engaged with the chassis, and the first extending arm defining a positioning slot; and a bracket configured to secure the storage device, comprising a first side plate, an elastic securing piece disposed on the first side plate, and a latch formed disposed outwards from the elastic securing piece; wherein the elastic securing piece abuts an inner surface of the first extending arm, and the latch is engaged into the positioning slot from the inner surface of the first extending arm and extends out of the first extending arm to mount the bracket to the carrier; a positioning post is mounted on an outer surface of the first side plate opposite to an inner surface of the first side plate, and a positioning hole is defined on the first extending arm to engage to the positioning post; the bracket comprises a bottom plate substantially perpendicular to the first side plate; the bracket is moved along a first direction, substantially perpendicular to the bottom plate, when the bracket is secured to the carrier.

2. The mounting apparatus of claim 1, wherein an indentation is defined in the first extending arm, and a clipping piece is connected between two opposite sides of the indentation to form the positioning slot.

3. The mounting apparatus of claim 1, wherein a hook is disposed on the inner surface of the first side plate, and the hook is capable of being inserted into a through hole of the storage device.

4. The mounting apparatus of claim 1, wherein the positioning post comprises a head and a neck having a less diameter than that of the head; and the neck is located in the positioning hole, and the head is located outside of the first side plate.

5. The mounting apparatus of claim 1, wherein a number of dissipating holes are defined in the bottom plate.

6. The mounting apparatus of claim 5, wherein the carrier comprises a connecting arm connected to the first extending arm, and the handle is rotatably mounted on the connecting arm; and a spring extends from the bottom plate and is secured to the connecting arm.

7. The mounting apparatus of claim 5, wherein an extending direction of the positioning slot is substantially perpendicular to the first direction.

8. The mounting apparatus of claim 1, wherein a protrusion is located on the handle, a separating panel is disposed in the chassis, and a slot is defined in the separating panel to receive to the protrusion.

9. The mounting apparatus of claim 8, wherein the handle comprises a clipping portion and a rotating portion engaged with the clipping portion; and a catch is formed at a free end of the rotating portion to engage with the clipping portion.

10. A mounting apparatus for a storage device, the mounting apparatus comprising: a chassis comprising a plurality of separating panels; a carrier, located between two of the plurality of separating panels, and comprising a first extending arm and a handle mounted to one of the plurality of separating panels, and a positioning hole is defined in the first extending arm; a bracket comprising a first side plate, a hook and a positioning post are disposed on two opposite sides of the first side plate; wherein an elastic securing piece is disposed at the center of the first side plate, a latch is disposed outwards from the elastic securing piece, and a positioning slot is defined to engage with the latch; wherein the elastic securing piece abuts an inner surface of the first extending arm, and the latch extends out of the first extending arm to mount the bracket to the carrier; wherein the bracket comprises a bottom plate substantially perpendicular to the fist side plate; and wherein the bracket is moved along a first direction, substantially perpendicular to the bottom plate, when the bracket is secured to the carrier.

11. The mounting apparatus of claim 10, wherein the positioning post comprises a head and a neck having a less diameter than that of the head, and the neck is located in the positioning hole, the head is located outside of the first side plate.

12. The mounting apparatus claim 10, wherein an indentation is defined in the first extending arm, and a clipping piece is connected between opposite sides of the indentation, to define the positioning slot.

13. The mounting apparatus of claim 12, wherein the carrier comprises a connecting arm connected to the first extending arm, and the handle is rotatably mounted on the connecting arm; and a spring clip extends from the bottom plate and is secured to the connecting arm.

14. The mounting apparatus of claim 10, wherein a number of dissipating holes are defined in the bottom plate.

15. The mounting apparatus of claim 14, wherein an extending direction of the positioning slot is substantially perpendicular to the first direction.

16. The mounting apparatus of claim 10, wherein a protrusion is located on the handle, and a slot is defined in each of the plurality of separating panels to receive to the protrusion.

17. The mounting apparatus of claim 10, wherein the handle comprises a clipping portion and a rotating portion engaged with the clipping portion; and a catch is formed at a free end of the rotating portion to engage with the clipping portion.

18. The mounting apparatus of claim 10, wherein the hook is capable of inserting into a through hole of the storage device when the storage device is moved toward the bracket, and the positioning post is engaged in the positioning hole when the bracket is moved towards the carrier to secure the bracket to the carrier.

* * * * *